United States Patent
Hokari (10) Patent No.: US 8,362,762 B2
(45) Date of Patent: Jan. 29, 2013

(54) MAGNETIC FIELD MEASUREMENT DEVICE

(75) Inventor: Ryuji Hokari, Ota (JP)

(73) Assignee: Seiko Epson Corporation, Tokyo (JP)

( * ) Notice: Subject to any disclaimer, the term of this patent is extended or adjusted under 35 U.S.C. 154(b) by 449 days.

(21) Appl. No.: 12/725,074

(22) Filed: Mar. 16, 2010

(65) Prior Publication Data

US 2010/0237858 A1 Sep. 23, 2010

(30) Foreign Application Priority Data

Mar. 19, 2009 (JP) ................................. 2009-068906
Mar. 19, 2009 (JP) ................................. 2009-068907
Mar. 2, 2010 (JP) ................................. 2010-044954

(51) Int. Cl.
*G01R 33/02* (2006.01)
(52) U.S. Cl. ..................................................... 324/244.1
(58) Field of Classification Search .................. None
See application file for complete search history.

(56) References Cited

U.S. PATENT DOCUMENTS

| | | | | |
|---|---|---|---|---|
| 4,947,107 A | * | 8/1990 | Doerfler et al. ................ 324/96 |
| 4,973,899 A | * | 11/1990 | Jones et al. ..................... 324/96 |
| 5,451,864 A | * | 9/1995 | Nakamoto ....................... 324/96 |
| 5,485,079 A | * | 1/1996 | Itoh .................................. 324/96 |
| 5,619,367 A | * | 4/1997 | Iwatsuka et al. ............... 359/283 |
| 5,691,837 A | * | 11/1997 | Itoh et al. ...................... 359/324 |
| 6,370,288 B1 | * | 4/2002 | Itoh et al. ......................... 385/12 |
| 6,756,781 B2 | * | 6/2004 | Duncan et al. ............. 324/244.1 |
| 2002/0145414 A1 | * | 10/2002 | Lanagan et al. ............ 324/76.11 |
| 2003/0146748 A1 | * | 8/2003 | Duncan et al. ............ 324/244.1 |
| 2006/0103380 A1 | * | 5/2006 | Kochergin et al. ........ 324/244.1 |
| 2006/0126990 A1 | * | 6/2006 | Deng et al. ....................... 385/12 |
| 2009/0250213 A1 | * | 10/2009 | Kalb et al. ................. 324/244.1 |
| 2010/0271004 A1 | * | 10/2010 | Bjorn ............................... 324/96 |

FOREIGN PATENT DOCUMENTS

JP A-07-077564 3/1995

* cited by examiner

*Primary Examiner* — Jermele M Hollington
(74) *Attorney, Agent, or Firm* — Oliff & Berridge, PLC (57) ABSTRACT

A magnetic field measurement device includes: a magneto-optical sensor that measures a first axial component of a magnetic field in the direction of a first axis that is arbitrarily set in the magnetic field that is to be measured; and a second magneto-optical sensor that measures a second axial component of the magnetic field in the direction of a second axis that form an angle q (0<q<90°) with the first axis.

13 Claims, 7 Drawing Sheets

MAGNETIC FIELD MEASUREMENT DEVICE

TECHNICAL FIELD

The present invention relates to a magnetic field measurement device.

BACKGROUND ART

For example, in the field of biometrics, a superconducting quantum interference device (SQUID) sensor that measures a magnetic field is known (refer to Patent Literature 1).

CITATION LIST

Patent Literature

[PTL 1] JP-A-7-77564

SUMMARY OF INVENTION

Technical Problem

SQUID sensors described in Patent Document 1 need to be arranged in a cubic form and cannot be applied to magneto-optical sensors.

The invention provides a magnetic field measurement device in which sensors do not need to be arranged in a cubic form and that can be applied to magneto-optical sensors.

Solution to Problem

The invention provides a magnetic field measurement device that includes: a first magneto-optical sensor that measures a first axial component of a magnetic field in the direction of a first axis that is arbitrarily set in the magnetic field that is to be measured; and a second magneto-optical sensor that measures a second axial component of the magnetic field in the direction of a second axis that forms an angle θ ($0°<θ<90°$) with the first axis.

It is preferable that the magnetic field measurement device further include a plurality of sensor groups, each sensor group having the first magneto-optical sensor and the second magneto-optical sensor, wherein the plurality of sensor groups is arranged so that the first axis of one of the plurality of sensor groups is parallel to the first axis of the other sensor groups.

It is preferable that the plurality of sensor groups be arranged on a flat surface. It is also preferable that the plurality of sensor groups be arranged evenly in the direction of a third axis and in the direction of a fourth axis on the flat surface, the fourth axis being perpendicular to the third axis.

It is preferable that the magnetic field measurement device further include rotating means for rotating the second magneto-optical sensor so that the second magneto-optical sensor measures a fifth axial component in the direction of a fifth axis that is different from the first axis and the second axis.

It is preferable that the magnetic field be generated by at least one current source and that the magnetic field device further include: determining means for determining whether or not the number of current sources is 2 or more on the basis of the measurement results acquired by the first magneto-optical sensor and the second magneto-optical sensor; and output means for outputting the result of the determination made by the determining means.

It is preferable that the magnetic field measurement device further include rotating means for rotating the second magneto-optical sensor so that the second magneto-optical sensor measures a fifth axial component in the direction of a fifth axis that is different from the first axis and the second axis, wherein the determining means makes the determination on the basis of the second and fifth axial components measured by the second magneto-optical sensor.

It is preferable that the magnetic field be generated by at least one current source and that the magnetic field measurement device further include: estimating means for estimating the position of the current source on the basis of the measurement results acquired by the first magneto-optical sensor and the second magneto-optical sensor; and output means for outputting the result of the estimation made by the estimating means.

It is preferable that the magnetic field measurement device further include rotating means for rotating the second magneto-optical sensor so that the second magneto-sensor measures a fifth axial component in the direction of a fifth axis that is different from the first axis and the second axis, wherein the estimating means makes the estimation on the basis of the second and fifth axial components measured by the second magneto-optical sensor.

In addition, the invention provides a magnetic field measurement device includes: a magneto-optical sensor that measures a measurement-axis component of a magnetic field along a measurement axis that is set in the magnetic field that is to be measured; rotating means for rotating the magneto-optical sensor so that after a first axis is set in the magnetic field as the measurement axis, a second axis that forms an angle θ with the first angle is set as the measurement axis, the angle θ satisfying the relationship of $0°<θ<90°$; and an acquiring section that acquires signals that represent the magnetic field measured by the magneto-optical sensor before and after the magneto-optical sensor is rotated by the rotating means.

It is preferable that the magnetic field measurement device further include a plurality of the magneto-optical sensors, wherein the rotating means rotates the magneto-optical sensors while the measurement axis of one of the magneto-optical sensors is parallel to the measurement axis of the other magneto-optical sensors.

In addition, the invention provides a magnetic field measurement device that includes: a first magneto-optical sensor that is rotatable around a rotational axis and measures a first axial component of a magnetic field along a first axis that is set in the magnetic field that is to be measured; a second magneto-optical sensor that measures a second axial component of the magnetic field along a second axis that is set in the magnetic field; rotating means for rotating the first magneto-optical sensor so that an angle formed between the first axis and the second axis satisfies the relationship of $0°<θ<90°$; and an acquiring section that acquires a signal that represents the magnetic field measured by the first magneto-optical sensor after the rotation performed by the rotating means.

It is preferable that the magnetic field measurement device further include a plurality of sensor groups, each sensor group having the first magneto-optical sensor and the second magneto-optical sensor, wherein the rotating means rotates the first magneto-optical sensors while the first axis of one of the plurality of sensor groups is parallel to the first axis of the other sensor groups.

It is preferable that the magnetic field measurement device further include an angle output section that outputs a signal that represents the angle changed by the rotating means.

It is preferable that the magnetic field be generated by at least one current source and that the magnetic field measurement device further include: determining means for determining whether or not the number of current sources is 2 or more on the basis of the measurement results acquired by the magneto-optical sensor before and after the rotation performed by the rotating means; and output means for outputting the result of the determination made by the determining means.

It is preferable that the magnetic field be generated by at least one current source and that the magnetic field measurement device further include: estimating means for estimating the position of the current source on the basis of the measurement results acquired by the first magneto-optical sensor and the second magneto-optical sensor; and output means for outputting the result of the estimation made by the estimating means.

It is preferable that the rotating means rotates the second magneto-optical sensor so that the second magneto-optical sensor measures a fifth axial component in the direction of a fifth axis that is different from the first axis and the second axis and that the estimating means make the estimation on the basis of the second and fifth axial components measured by the second magneto-optical sensor.

Advantageous Effects of Invention

The magnetic field measurement device uses the magneto-optical sensor (that measures the first axial component) and the magneto-optical sensor (that measures the second axial component) to acquire data on the first and second axial components of the magnetic field, while the sensors do not need to be arranged in a cubic form. Since the sensors can be two-dimensionally arranged in the magnetic field measurement device, a sensor portion can be formed in a thin structure, compared with a device having sensors that are arranged in a cubic form.

DESCRIPTION OF EMBODIMENTS

1. First Embodiment

Figure 1:
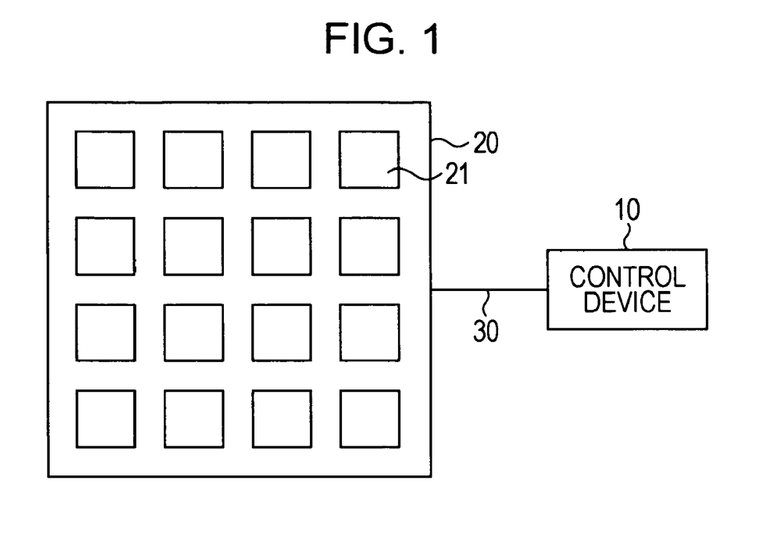
FIG. 1 is an outline diagram showing the configuration of a magnetic field measurement device 1 according to an embodiment.

FIG. 1 is an outline diagram showing the configuration of a magnetic field measurement device 1 according to a first embodiment of the invention. The magnetic field measurement device 1 has a control device 10 and a probe 20. The control device 10 receives a signal from the probe 20 and stores data and processes the stored data. The probe 20 outputs a signal that corresponds to a magnetic field (that is to be measured). A signal is transferred between the control device 10 and the probe 20 through a signal line 30.

Figure 2:
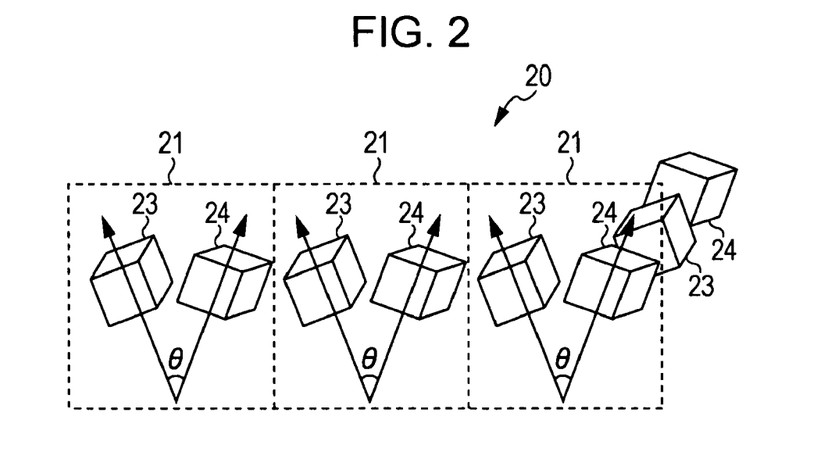
FIG. 2 is a diagram showing the configuration of a probe 20.

FIG. 2 is a diagram showing the configuration of the probe 20. The probe 20 has a plurality of sensor pairs 21 (an example of sensor groups). Each sensor pair 21 includes a magneto-optical sensor 23 (an example of a first magneto-optical sensor) and a magneto-optical sensor 24 (an example of a second magneto-optical sensor). The magneto-optical sensors 23 and the magneto-optical sensors 24 are vector sensors and measure components of the magnetic field (that is represented by a vector) in the directions of specified axes. In this example, the magneto-optical sensors 23 and the magneto-optical sensors 24 are magneto-optical sensors.

The magneto-optical sensors 23 measure components (hereinafter referred to as first axial components) of the magnetic field in the direction of a certain axis (hereinafter referred to as a first axis). The magneto-optical sensors 24 measure components (hereinafter referred to as second axial components) in the direction of an axis (hereinafter referred to as a second axis) that is different from the first axis. An angle $\theta$ that is formed between the first axis and the second axis satisfies the relationship of $0°<\theta<90°$.

In this example, the plurality of sensor pairs 21 is arranged in a matrix form on a flat surface so that the first axis of each sensor pair 21 is parallel to the first axis of the other sensor pairs 21. That is, all the magneto-optical sensors 23 are oriented in the same direction. The same applies to the magneto-optical sensors 24. The plurality of sensor pairs 21 is arranged so that sensors that are located adjacent to the magneto-optical sensors 23 are the magneto-optical sensors 24. The "matrix form" indicates that the sensors are arranged evenly (at equal intervals) on the flat surface in the direction of an axis (for example, x axis described later) and in the direction of another axis (for example, y axis described later) that is perpendicular to the axis.

The surface (e.g., a curved surface that includes the center of gravity of each sensor pair 21) on which the plurality of sensor pairs 21 is arranged is referred to as a "measurement surface". In this example, the measurement surface is flat.

Signals that are transmitted from the magneto-optical sensors 23 and signals that are transmitted from the magneto-optical sensors 24 are separately transferred through the signal line 30. The signals are transferred through the signal line 30 so that the magnitudes of the magnetic fields measured by the magneto-optical sensors 23 can be distinguished from each other. For example, the signal line 30 includes a bundle of signal lines that correspond to the magneto-optical sensors 23. The same applies to the magneto-optical sensors 24. The control device 10 is capable of separately receiving signals from the magneto-optical sensors 23 and signals from the magneto-optical sensors 24 and separately processing the signals transmitted from the magneto-optical sensors 23 and the signals transmitted from the magneto-optical sensors 24. In other words, the control device 10 is capable of separately receiving and processing the signals that represent the magnetic field measured along the first axis and the signals that represent the magnetic field measured along the second axis.

Figure 3:
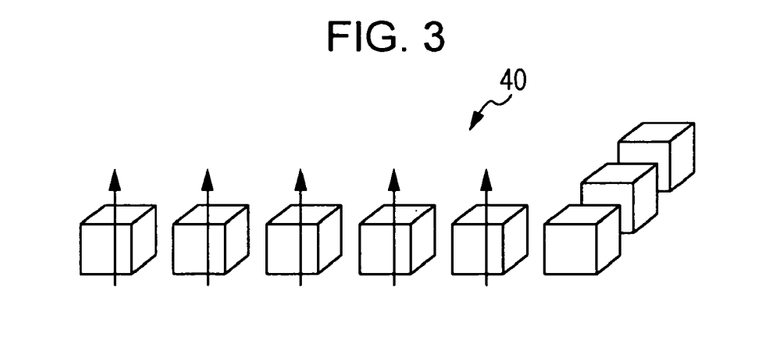
FIG. 3 is a diagram showing the configuration of a probe 40 that does not have a configuration of the invention.

FIG. 3 is a diagram showing the configuration of a probe 40 that does not have the configuration of the invention. A plurality of vector sensors is arranged in the probe 40 so that the measurement axes of all the vector sensors are parallel to each other. Specifically, the probe 40 outputs only signals that represent a magnetic field measured along a single axis. When the probe 40 is used to provide data on components that are measured along the single axis, there is almost no difference between data acquired when a magnetic field generated from a single current source is measured along the single axis and data acquired when magnetic fields generated from two current sources that are located close to each other are measured along the single axis. Thus, it is difficult to separate the current sources. On the other hand, when the probe 20 according to the present embodiment is used, it is easy to separate the current sources on the basis of a difference between data on components that are measured along the two axes.

Figure 4:
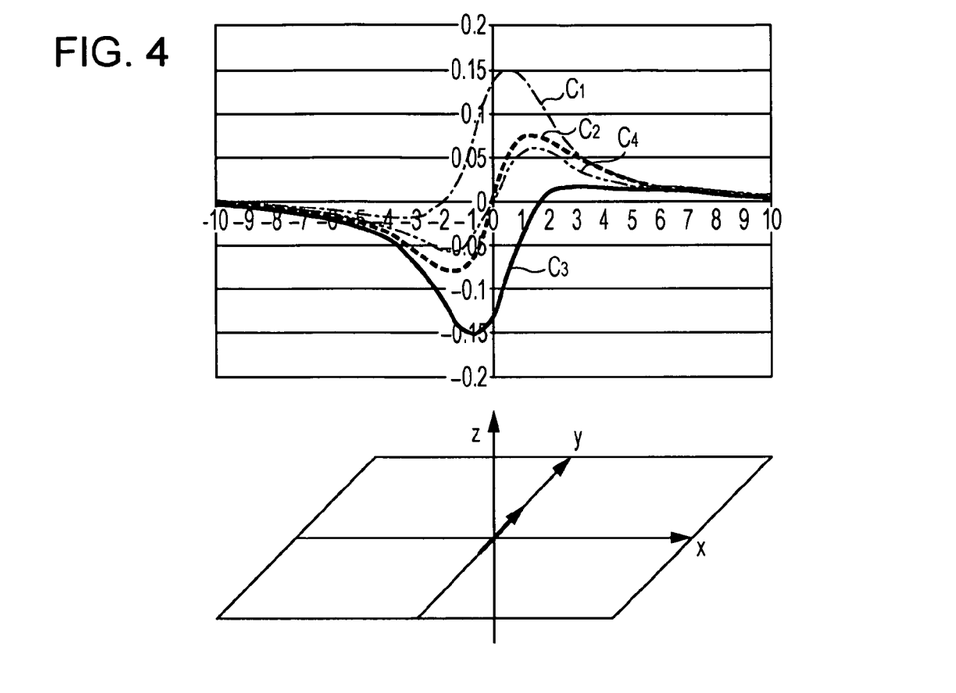
FIG. 4 is a diagram showing, as an example, measurement data acquired by the probe 20 and the probe 40.

FIG. 4 is a diagram showing, as an example, measurement data acquired by the probe 20 and the probe 40. In FIG. 4, the abscissa represents the position (arbitrary units), and the ordinate represents the magnitude (arbitrary units) of the magnetic field. In the example shown in FIG. 4, the number of current sources is 1. In an xyz orthogonal coordinate system, the current source is located at (0, 0, 0); the magnitude of a minute current vector $I_1 \Delta_S$ is 0.8; the angle θ of the probe 20 is 20°; and the vertical positions of the probes 20 and 40 with respect to the current source are 2, in this example. The magneto-optical sensors 23 and the magneto-optical sources 24 are inclined so that the angle formed between the magneto-optical sensors 23 and the z axis is the same as the angle formed between the magneto-optical sensors 24 and the z axis. The magnetic field is calculated using the Biot-Savart law (formula (1)). The magnetic field that is located at a measurement point is oriented perpendicular to both the position vector r of the measurement point and the minute current vector $I_1 \Delta_S$. The total magnetic field is calculated by summing magnetic fields generated from minute current sources.

[Formula 1]

$$dB = \frac{\mu_0}{4\pi} \frac{I \cdot ds \times r}{r^3} \quad (1)$$

In FIG. 4, a curve C2 represents measurement results acquired by the probe 40; curves C1 and C3 represent measurement results acquired by the magneto-optical sensors 23 and the magneto-optical sensors 24; and a curve C4 represents the average values of the measurement results acquired by the magneto-optical sensors 23 and the measurement results acquired by the magneto-optical sensors 24.

Figure 5:
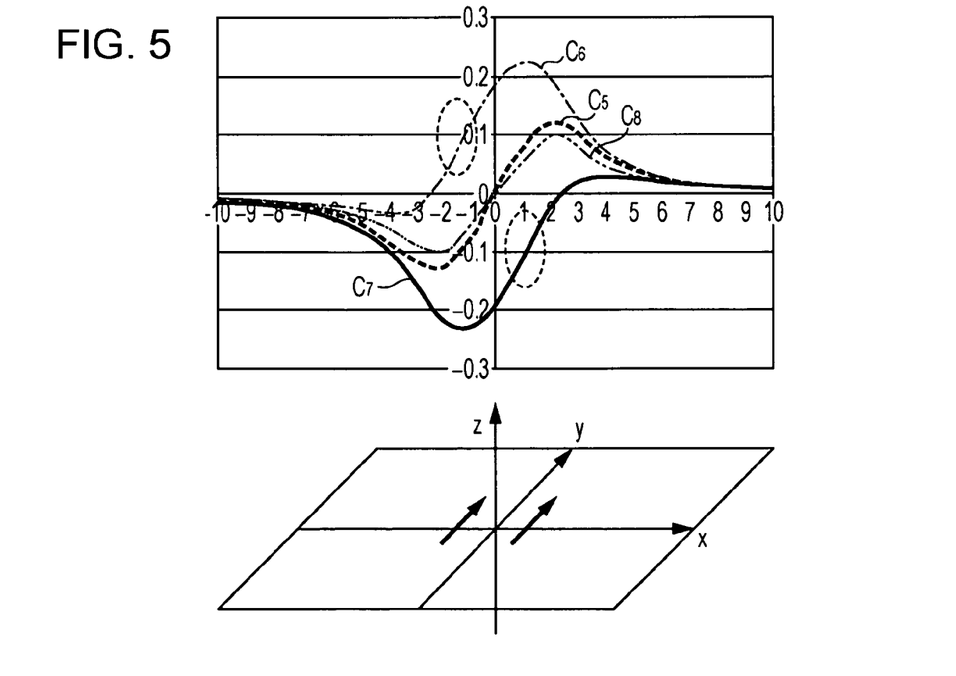
FIG. 5 is a diagram showing, as an example, other measurement data acquired by the probe 20 and the probe 40.

FIG. 5 is a diagram showing, as an example, other measurement data acquired by the probe 20 and the probe 40. In FIG. 5, the abscissa represents the position (arbitrary units), and the ordinate represents the magnitude (arbitrary units) of the magnetic field. In the example shown in FIG. 5, a current source that is represented by the equation $I_1 \Delta_S = 0.8$ is located at (1, 0, 0); and a current source that is represented by the equation $I_2 \Delta_S = 0.8$ is located at (−1, 0, 0). In FIG. 5, a curve C5 represents measurement results acquired by the probe 40; curves C6 and C7 represent measurement results acquired by the magneto-optical sensors 23 and the magneto-optical sensors 24; and a curve C8 represents the average values of the measurement results acquired by the magneto-optical sensors 23 and the measurement results acquired by the magneto-optical sensors 24.

As apparent from comparison of FIGS. 4 and 5, there is almost no difference between the shape of the curve (curve C4) that represents the average values acquired when the number of current sources is 1 and the shape of the curve (curve C8) that represents the average values acquired when the number of current sources is 2. However, there are differences (shown by broken lines of FIG. 5) between the curves (curves C1 and C3) that represent the measurement data acquired by the magneto-optical sensors 23 and 24 when the number of current sources is 1 and the curves (C6 and C7) that represent the measurement data acquired by the magneto-optical sensors 23 and 24 when the number of current sources is 2. It is considered that this difference reflects the difference between the numbers of the current sources. It is considered that the control device 10 processes the measurement data to allow the two current sources to be separated from each other.

Figure 6:
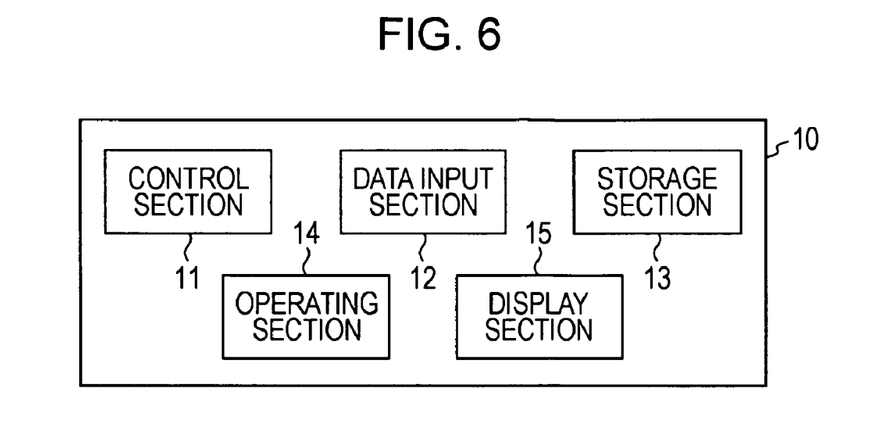
FIG. 6 is a diagram showing the configuration of a control device 10.

FIG. 6 is a diagram showing the configuration of the control device 10. The control device 10 has a control section 11, a data input section 12, a storage section 13, an operating section 14 and a display section 15. The control section 11 controls each element of the control device 10. The control section 11 has a CPU (Central Processing Unit), a ROM (Read Only Memory) and a RAM (Random Access Memory). The data input section 12 outputs, to the control section 11, a signal that has been received from the probe 20 by the control device 10. The storage section 13 stores measurement data and a program. The storage section 13 has a nonvolatile storage device such as a HDD (Hard Disk Drive) or a flash memory. The operating section 14 receives an operation performed by a user and outputs, to the control section 11, a signal that corresponds to the operation performed by the user. The display section 15 displays, under the control of the control section 11, an image that represents measurement results, a menu screen, and various messages.

Figure 7:
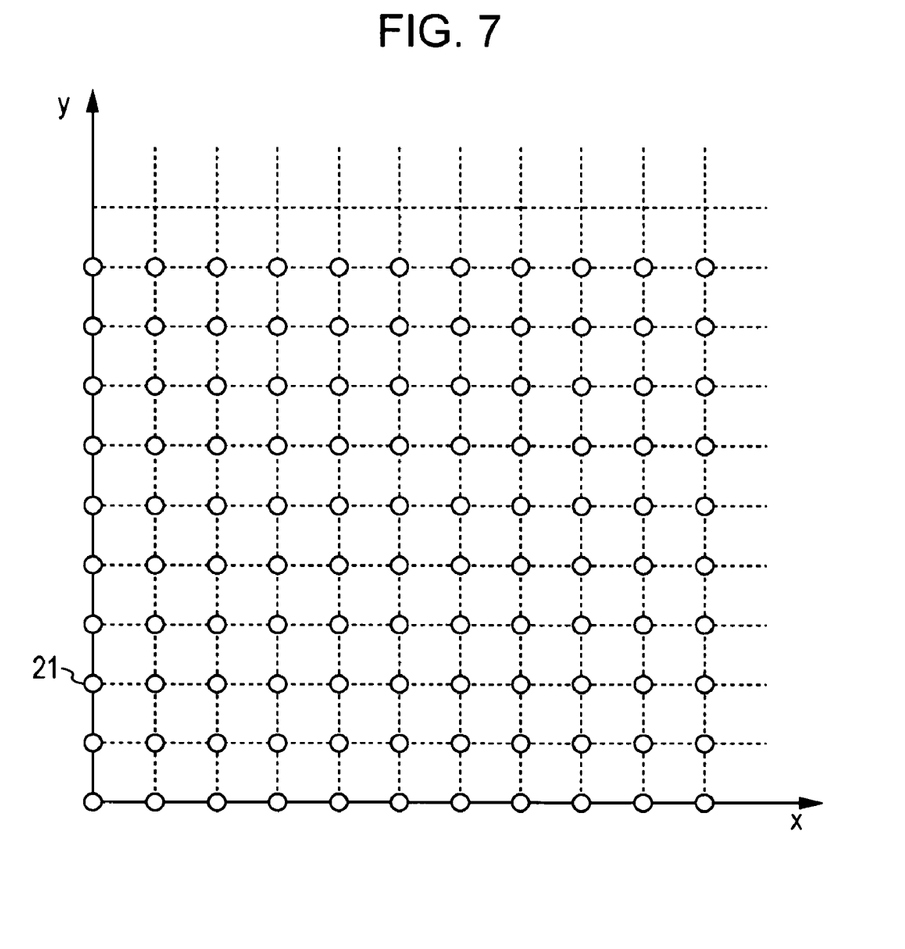
FIG. 7 is a diagram showing, as an example, an arrangement of sensor pairs 21.

FIG. 7 is a diagram showing, as an example, an arrangement of the sensor pairs 21. In this example, the sensor pairs 21 are located at grid points on an xy plane (measurement surface). The x and y axes are straight lines that are included in the measurement surface and are perpendicular to each other. In FIG. 7, the positions of the sensor pairs 21 are represented using the xy coordinate system. For example, the position of the sensor pair 21 that is located at the origin is represented by (0, 0); and the position of the sensor pair 21 that is located at a point of (x=1, y=2) is represented by (1, 2).

Figure 8:
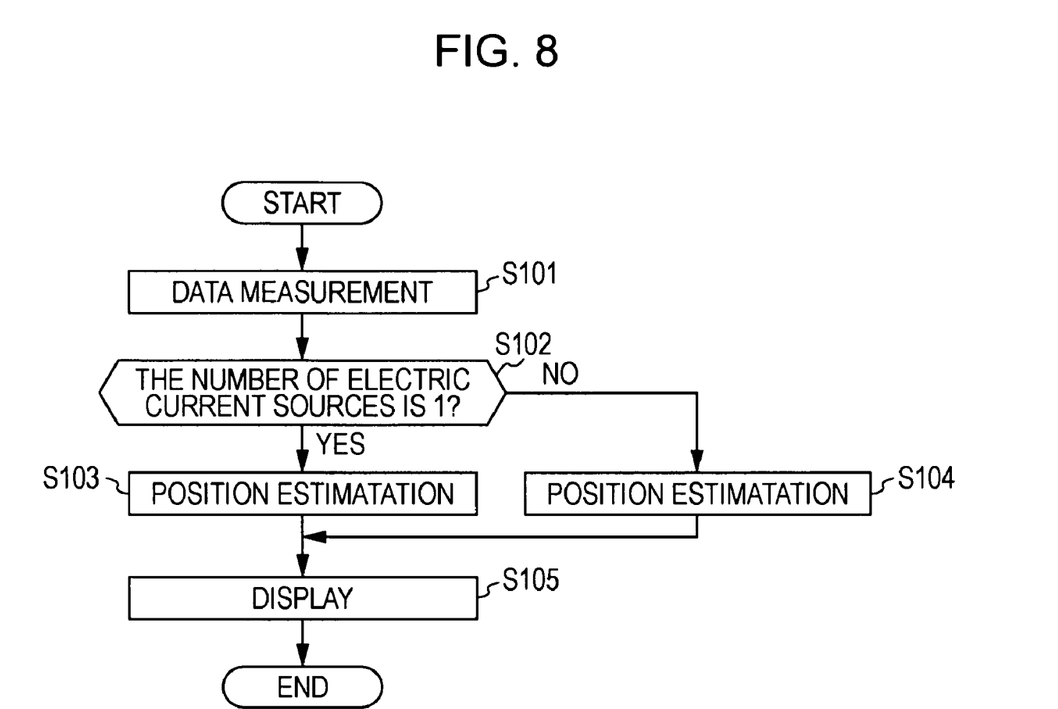
FIG. 8 is a flowchart showing operations of the control device 10.

FIG. 8 is a flowchart showing operations of the control device 10. The flow of FIG. 8 is executed by using, as a trigger, a predetermined command that is entered by the user through the operating section 14. In step S101, the control section 11 stores, as data in the storage section 13, measurement results that are represented by a signal received from the probe 20 through the data input section 12. The details are described as follows. The measurement result output from each sensor pair 21 represents the magnitude of the magnetic field. The control section 11 stores, as the measurement data in the storage section 13, a data set that includes the magnitude of the magnetic field and the coordinates of the sensor pair 21 that outputs the measurement results. For example, when the magnitude Bm of the magnetic field that is measured by the sensor pair 21 located at (1, 2) is 100, data that is represented by the equation (Bm, x, y)=(100, 1, 2) is stored in the storage section 13 as the measurement data. That is, the data stored in the storage section 13 represents the relationship between the magnitude of the magnetic field and the position, as shown by the curves C1 and C3 of FIG. 4 and the curves C6 and C7 of FIG. 5.

In step S102, the control section 11 determines, on the basis of the acquired measurement data, whether the number of current sources is 1 or 2 or more. The determination is made, for example, as follows. The storage section 13 has stored therein typical curves (hereinafter referred to as reference curves that are used as references for comparison) that are provided for the case in which the number of current sources is 1 and represent the relationship between the magnitude of the magnetic field and positional characteristics. The control section 11 normalizes the measurement data (or normalizes the magnitude of the magnetic field and the position) and compares the normalized measurement data with the reference curves. The comparison process includes calculation of a square error and determination of whether or not the calculated square error is larger than a predetermined threshold. When the square error is not larger than the threshold, the control section 11 determines that the number of current sources is 1. When the square error is larger than the threshold, the control section 11 determines that the number of current sources is 2 or more. When it is determined that the number of current sources is 1 (S102: YES), the control section 11 causes the process to proceed to step S103. When it is determined that the number of current sources is 2 or more (S102: NO), the control section 11 causes the process to proceed to step S104.

Figure 9:
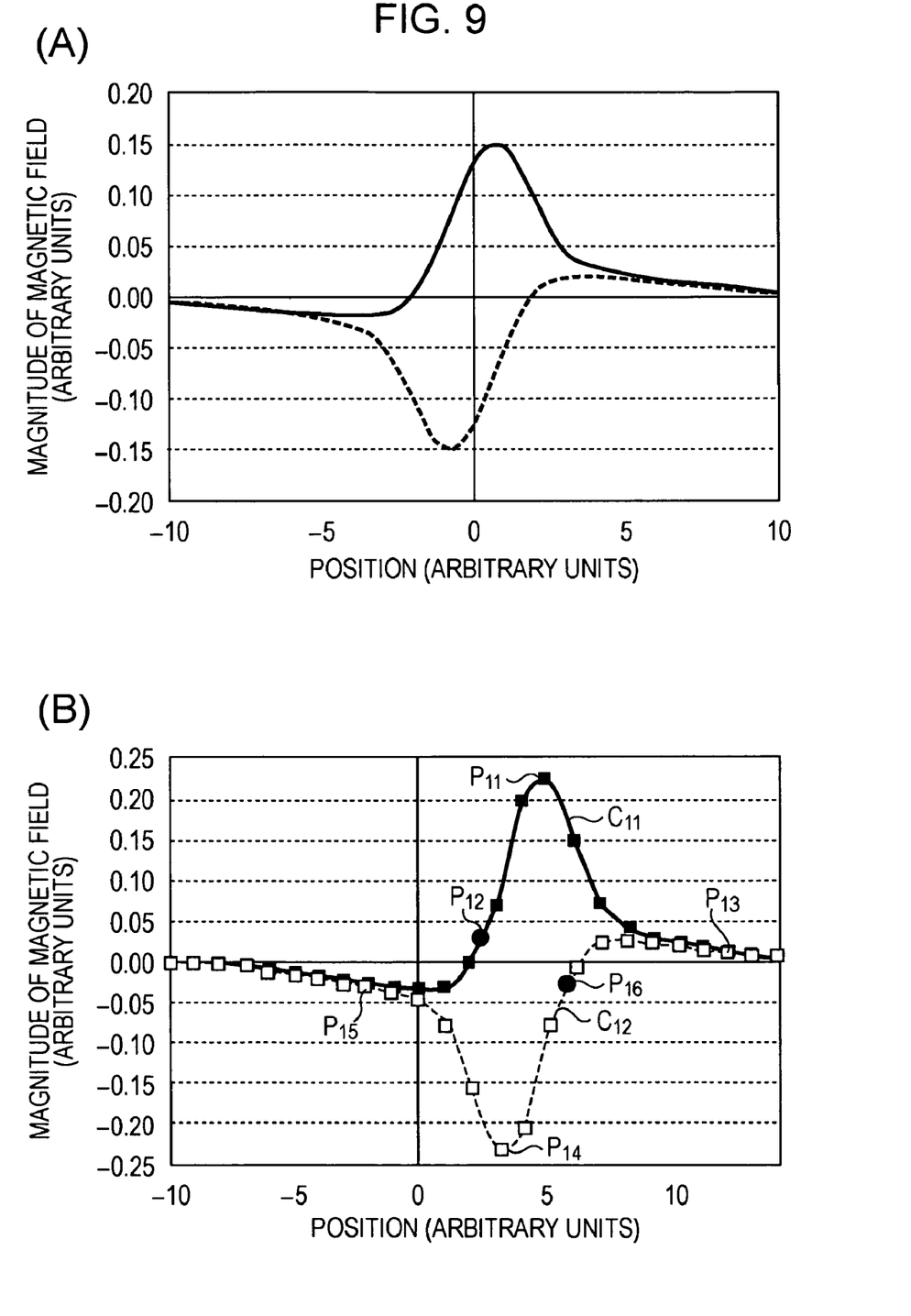
FIG. 9 are diagrams explaining a determining process in which reference curves are used.

FIG. 9 are diagrams explaining the determination process in which the reference curves are used. The determination process of step S102 is described in detail below with reference to FIG. 9. FIG. 9(A) is a diagram showing an example of the reference curves, while FIG. 9(B) is a diagram showing an example of the measurement data. In FIGS. 9(A) and 9(B), the abscissa represents the position (arbitrary units), and the ordinate represents the magnitude (arbitrary units) of the magnetic field. Since the measurement data includes three components Bm, x and y, the measurement data is three-dimensionally represented. In order to simplify the description, y is fixed (e.g., y=k) and the measurement data is two-dimensionally represented by Bm and x. FIG. 9(B) shows plots of the measurement data. Curves C11 and C12 are curves acquired by causing the measurement data acquired by the magneto-optical sensors 23 and the magneto-optical sensors 24 to be subjected to interpolation and least squares methods and the like.

The measurement data is normalized, for example, as follows. The control section 11 extracts, from the measurement data, a point at which the magnitude of the magnetic field is maximal and 10 percent width points. The "10 percent width points" are points at which the magnitude of the magnetic field is 10% of the maximum value of the magnitude of the magnetic field and that are located closest to the point at which the magnitude of the magnetic field is maximal and are located on respective positive and negative sides of the maximal point. In FIG. 9(B), a point P11 represents the maximal point on the curve C11, while points P12 and P13 represent the 10 percent width points on the curve C11. A point P14 represents the maximal point on the curve C12, while points P15 and P16 represent the 10 percent width points on the curve C12. The control section 11 shifts the curves (that represent the measurement data) along the axis (that represents the position) so that the maximal points of the measurement data match the maximal points on the reference curves. In addition, the control section 11 enlarges and reduces the measurement data in the direction of the axis (that represents the position) and in the direction of the axis (that represents the magnitude of the magnetic field) so that the positions and magnitudes of the maximal points of the measurement data and the positions and magnitudes of the 10 percent width points of the measurement data match the positions and magnitudes of the maximal points of the reference curves and the positions and magnitudes of the 10 percent width points of the reference curves. The control section 11 calculates square errors between the normalized measurement data and the reference curves. The control section 11 compares the square errors with the threshold to determine the number of current sources.

Refer to FIG. 8 again. In step S103, the control section 11 estimates the position of the single current source. The position estimation is made, for example, as follows. The storage section 13 has stored therein angles (e.g., angles formed between the normal vector of the measurement surface of the probe 20 and measurement axes of the magneto-optical sensors 23 (24)) of the measurement axes of the magneto-optical sensors 23 and 24, the positions of the magneto-optical sensors 23, and the positions of the magneto-optical sensors 24. When the number of current sources is 1, the control device 10 acquires the position of the current source on the basis of an intersection of a curve that represents the position (of the current source) estimated by means of signals transmitted from the magneto-optical sensors 23 and a curve that represents the position (of the current source) estimated by means of signals transmitted from the magneto-optical sensors 24. The details are described as follows. The control section 11 selects, from among the magneto-optical sensors 23, one that is to be processed. The single magneto-optical sensor 23 measures the magnitude (a magnetic field vector that is caused by the current source) of a measurement-axis component of the magnetic field.

Figure 10:
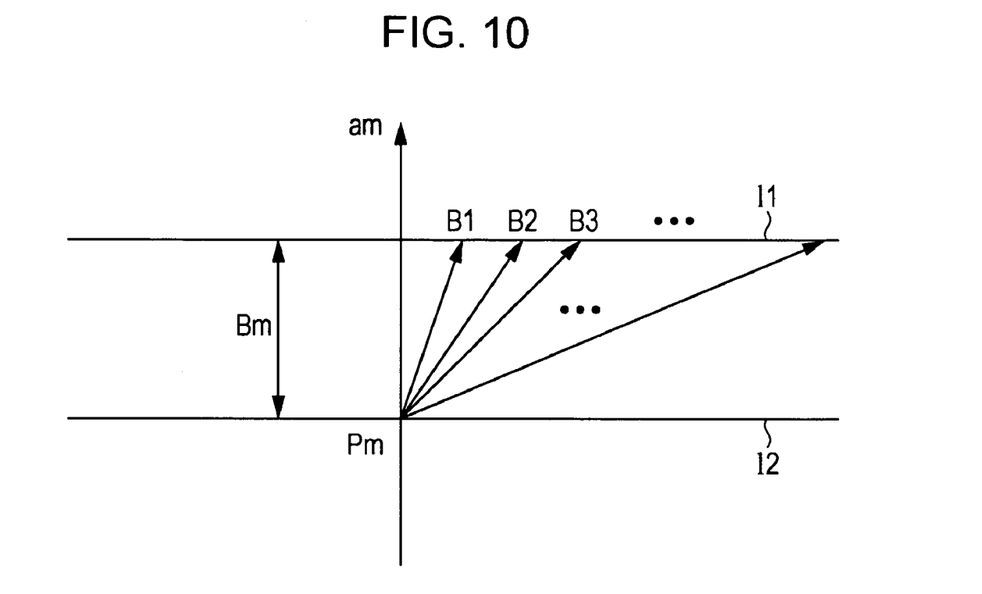
FIG. 10 is a diagram showing, as an example, a magnetic field that is measured by a magneto-optical sensor 23.

FIG. 10 is a diagram showing, as an example, the magnetic field that is measured by the magneto-optical sensor 23. An axis am represents the measurement axis of the magneto-optical sensor 23. The magnitude Bm of the magnetic field represents the magnitude of the magnetic field measured by the magneto-optical sensor 23. A point Pm represents a measurement point, i.e., the position of the magneto-optical sensor 23. A line l1 represents a straight line that passes through the point Pm and is perpendicular to the axis am. A line l1 represents a straight line that is parallel to the straight line l1 and is separated from the straight line l1 by a distance that is equal to Bm. Magnetic field vectors (candidates for the magnetic field vectors) are vectors that pass through the point Pm and have a length of Bm in the direction of the axis am, as illustrated by vectors B1, B2, B3, . . . . Position vectors r that represent the position of the current source pass through the point Pm and are perpendicular to the vectors B1, B2, B3, . . . and have a length that satisfies the Biot-Savart law (formula (1)). The position (candidates for the position of the current source) of the current source, which is represented by the position vectors r acquired in the aforementioned manner, represents a curve on a flat plane shown in FIG. 10. This curve is hereinafter referred to as a curve CA. In this manner, the control section 11 calculates candidates for the position of the current source on the basis of the magnitude (of the magnetic field) acquired from the magneto-optical sensor 23 that is to be processed and the position of the magneto-optical sensor 23. Next, the control section 11 calculates candidates for the position of the current source in a similar manner on the basis of the magneto-optical sensor 24 that pairs with the magneto-optical sensor 23 that is to be processed. The candidates for the position of the current source are a series of points on a curve (hereinafter referred to as a curve CB) represented using, as a reference, the position of the magneto-optical sensor 24 that is to be processed. The control section 11 stores, in the storage section 13, an intersection of the curve CA and the curve CB as data that represents a candidate for the position of the current source. The control section 11 sequentially treats all the sensor pairs 21 as sensors to be processed and acquires points that represent candidates for the position of the current source in the same manner. The positions of those points are the same in an ideal case, but may not actually the same. The control section 11 calculates coordinates of a point that is located in a region in which the density of points is the highest among the plurality of points acquired. The control section 11 stores, in the storage section 13, the coordinates as estimated values of the position of the current source. When the control section 11 stores the estimated values of the position of the current source, the control section 11 causes the process to proceed to step S105.

The case in which y=k is described above. The control section 11 calculates estimated values of the position of the current source in the cases in which y=1, 2, ..., and ymax. In this manner, three-dimensional estimated values of the position of the current source can be acquired.

Refer to FIG. 8 again. In step S104, the control section 11 estimates the positions of a plurality of current sources. The position estimation is made, for example, as follows. The storage section 13 has stored therein reference curves that are provided for the case in which a plurality of current sources exist at different positions. For example, certain reference curves represent reference curves that are provided for the case in which current sources are located at (1, 0, 0) and (−1, 0, 0). Other reference curves represent reference curves that are provided for the case in which current sources are located at (0, 1, 0) and (−1, 0, 0). The control section 11 normalizes the measurement data and compares the normalized measurement data with the plurality of reference curves. The control section 11 stores, as estimated values of the positions of the current sources in the storage section 11, the positions (of the current sources) that are represented by the reference curve whose matching degree (e.g., inverse of a square error) is the highest among the plurality of reference curves. When the control device 11 stores the estimated values of the positions of the current sources, the control section 11 causes the process to proceed to step S105.

In step S105, the control section 11 causes the display section 15 to display the estimated values (of the positions of the current sources) stored in the storage section 13. According to the present embodiment, the magneto-optical sensors that measure the first axial components and are arranged on the flat surface and the magneto-optical sensors that measure the second axial components and are arranged on the flat surface are used to acquire information on the two axes. Thus, data on the first axial components of the magnetic field generated from the current sources and data on the second axial components of the magnetic field generated from the current sources can be acquired, while the sensors do not need to be arranged in a cubic form. It can be determined, on the basis of the data, whether or not the number of current sources is 1 or 2 or more. In addition, the position of the current source can be estimated. The magnetic field measurement device 1 is used to measure a magnetic field that is caused by an electric current generated by an activity of a living body such as a brain, a peripheral nerve or a heart. The sensors can be two-dimensionally arranged in the magnetic field measurement device. Thus, the sensor portion (probe 20) can be formed in a thin structure in the magnetic field measurement device, compared with a device having sensors that are arranged in a cubic form.

The invention is not limited to the aforementioned embodiment and can be applied to various modified examples. Some modified examples are described below. Two or more of the modified examples described below may be combined.

Figure 11:
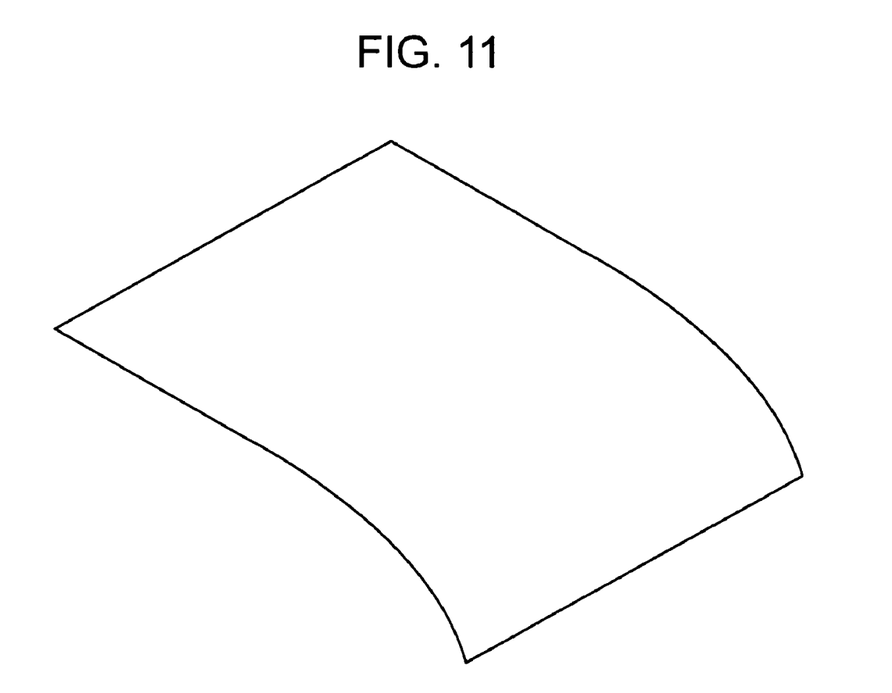
FIG. 11 is a diagram showing, as an example, the shape of a measurement surface according to another example.

FIG. 11 is a diagram showing the shape of a measurement surface according to another example. In this example, the measurement surface is not flat and is curved. When the curved surface is, for example, used for medical purposes, this surface is a surface curved along the shape of a human body. As described above, the measurement surface is not limited to a flat surface and may be a curved surface.

Figure 12:
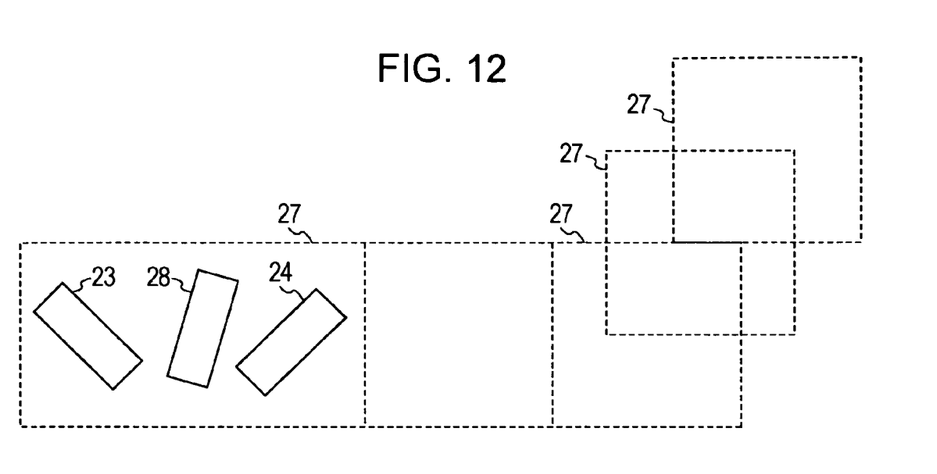
FIG. 12 is a diagram showing the configuration of a probe 20 according to another example.

FIG. 12 is a diagram showing the configuration of a probe 20 according to another example. In this example, the probe 20 has sensor groups 27. Each sensor group 27 includes a magneto-optical sensor 23, a magneto-optical sensor 24 and a magneto-optical sensor 28. Measurement axes of the magneto-optical sensors 23, 24 and 28 are not located on a single flat plane. According to this configuration, in step S103 of FIG. 8, curves that represent candidates for the position of a current source can be acquired by the respective magneto-optical sensors 23, 24 and 28. The control section 11 acquires, from a single sensor group 27, an intersection (or a point located in a region in which the density of the curves is the highest) of the three curves as estimated values (of the position of the current source).

The position of the current source is estimated using the sensor group 27, for example, as follows. In this example, the measurement axes of the magneto-optical sensors 23 and 24 are inclined in the x axial direction and are not inclined in the y axial direction (i.e., the azimuths are 0 degrees when the x axis is a reference). The measurement axis of the magneto-optical sensor 28 is inclined in the y axial direction and is not inclined in the x axial direction (i.e., the azimuth is 90 degrees). The control section 11 selects, from among the plurality of magneto-optical sensors 23, a magneto-optical sensor 23 that is to be processed. The control section 11 calculates candidates for the position of the current source on the basis of the magnitude (of the magnetic field) acquired by the magneto-optical sensor 23 and the position of the magneto-optical sensor 23. The candidates for the position of the current source represent a curve (curve CA) that satisfies the Biot-Savart law. Next, the control section 11 selects, from among the plurality of magneto-optical sensors 24, a magneto-optical sensor 24 that is to be processed. The control section 11 acquires a curve (curve CB) that represents candidates for the position of the current source on the basis of the magnitude (of the magnetic field) acquired by the magneto-optical sensor 24 that is to be processed and the position of the magneto-optical sensor 24.

Next, the control section 11 acquires measurement data that is represented on a flat plane that includes the measurement axis of the magneto-optical sensor 23 and the measurement axis of the magneto-optical sensor 28. When polar angles of the measurement axes of the magneto-optical sensors 23 and 28 are, for example, 45 degrees, the flat plane is a plane whose normal vector is represented by (x=−1, y=1, z=1). Specifically, the flat plane that includes the measurement axis of the magneto-optical sensor 23 and the measurement axis of the magneto-optical sensor 28 is determined on the basis of the polar angles and azimuths of the measurement axes of the magneto-optical sensors 23, 24 and 28. A plot of the measurement data may not be placed on the flat plane depending on the polar angles and azimuths of the measurement axes. In this case, the control section 11 interpolates measurement data that is close to the flat plane to acquire the measurement data that is represented on the flat plane. The acquired measurement data represents the magnitude of the magnetic field and the positions in the same manner as shown in FIG. 9(B). The control section 11 acquires a curve (hereinafter referred to as a curve CC) that represents candidates for the position of the current source on the flat plane.

In addition, the control section 11 acquires measurement data that is represented on a flat plane that includes the measurement axis of the magneto-optical sensor 24 and the measurement axis of the magneto-optical sensor 28. The control section 11 acquires, from the acquired measurement data, a curve (hereinafter referred to as a curve CD) that represents candidates for the position of the current source on the flat plane. The details of the process are the same as or similar to the process for calculating the curve CC.

The control section 11 calculates estimated values of the position of the current source on the basis of the curve CA, the curve CB, the curve CC and the curve CD. In an ideal case, these curves cross at a single point. However, the curves may not actually cross at a single point. The curve CA, the curve CB, the curve CC and the curve CD cross at up to four points. The control section 11 acquires estimated values of the position of the current source on the basis of the four points. For example, the control section 11 estimates the position of the current source on the basis of an intersection of diagonals of a quadrangle that has corners located at the four points. The control section 11 may estimate the position of the current source on the basis of the center of gravity of the quadrangle that has the corners located at the four points. In another example, the control section 11 may estimate the position of the current source on the basis of the center of a circle that circumscribes the four points.

The number of the sensor pairs 21 that are included in the probe 20 is not restricted to the numbers described in the embodiment. The probe 20 may have a single sensor pair 21.

The magneto-optical sensors 23 that are included in the probe 20 need not be oriented in the same direction. The same applies to the magneto-optical sensors 24.

The sensor pairs 21 that are included in the probe 20 need not be arranged in a matrix form. For example, the sensor pairs 21 may be randomly arranged.

Either the process of step S103 shown in FIG. 8 or the process of step S104 shown in FIG. 8 may be omitted. In other words, the control device 10 may display only the result of the determination of whether or not the number of current sources is 1 or 2 or more.

2. Second Embodiment

Figure 13:
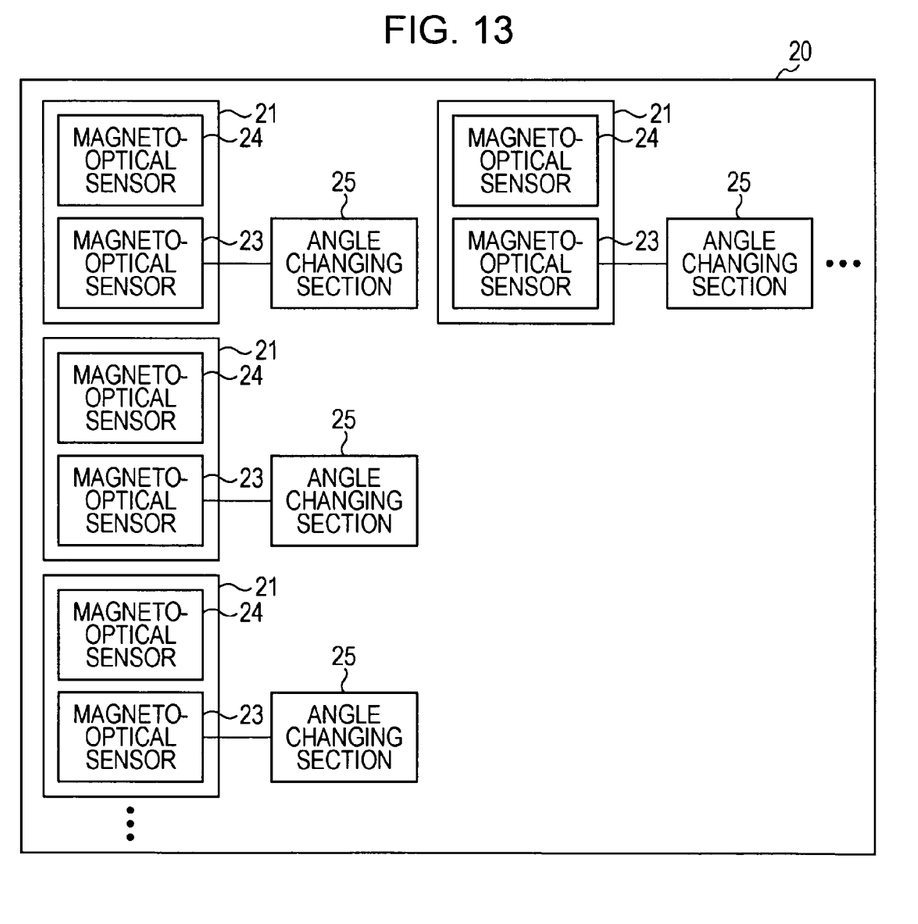
FIG. 13 is a diagram showing the configuration of a probe 20 according to a second embodiment.

FIG. 13 is a diagram showing the configuration of a probe 20 according to a second embodiment. Common elements with the first embodiment are denoted by common reference numerals with the first embodiment. Angle changing sections 25 rotate the magneto-optical sensors 23 around rotary shafts 26 to change the angles θ. The rotary shafts 26 are fixed to a housing of the probe 20, for example. Each angle changing section 25 has a stepping motor or a piezoelectric element. The angle changing sections 25 change the angles of the magneto-optical sensors 23 on the basis of a control signal transmitted from the control device 10.

In this example, the control device 10 receives signals that represent the measurement results acquired by the magneto-optical sensors 23 and 24 before and after the angle changing section 25 is operated, i.e., after the angles θ are changed. The control device 10 may receive the measurement results acquired by the magneto-optical sensors 24 before the angle changing section 25 is operated and receive the measurement results acquired by the magneto-optical sensors 23 after the angle changing section 25 is operated.

The invention is not limited to the aforementioned embodiments and can be applied to various modified examples. Some modified examples are described below. Two or more of the modified examples described below may be combined. In addition, the modified examples described below may be combined with the modified examples described in the first embodiment.

In the embodiment, the probe 20 includes the rotatable magneto-optical sensors (magneto-optical sensors 23) and the non-rotatable magneto-optical sensors (magneto-optical sensors 24). The embodiment describes the case in which the two types of magneto-optical sensors acquire values that are measured along the two measurement axes. However, the probe 20 may be configured so that all the magneto-optical sensors can rotate and acquire values that are measured along a measurement axis before the rotations and values that are measured along a measurement axis after the rotations. In this case, all the magneto-optical sensors of the probe are oriented in the same direction. The angle changing section 25 rotates the magneto-optical sensors so that an angle θ formed between the measurement axis set before the rotations and the measurement axis set after the rotations satisfies the relationship of $0°<θ<90°$.

The probe 20 may have a sensor that measures the angle of the magneto-optical sensor 23. The "angle of the magneto-optical sensor 23" indicates any angle such as an angle formed between the measurement axis of the magneto-optical sensor 23 and the measurement surface or the angle formed between the measurement axis of the magneto-optical sensor 23 and the measurement axis of the magneto-optical sensor 24 as long as the angle of the magneto-optical sensor 23 is used to specify the angle formed between the first axis and the second axis. The control device 10 stores an angle represented by a signal transmitted from this sensor and measurement values transmitted from the magneto-optical sensors 23.

REFERENCE SIGNS LIST

1: Magnetic field measurement device
10: Control device
20: Probe
21: Sensor pair
23: Magneto-optical sensor
24: Magneto-optical sensor
30: Signal line
40: Probe

The invention claimed is:

1. A magnetic field measurement device comprising:
a first magneto-optical sensor that measures a first axial component of a magnetic field in the direction of a first axis that is arbitrarily set in the magnetic field that is to be measured; and
a second magneto-optical sensor that measures a second axial component of the magnetic field in the direction of a second axis that forms an angle θ ($0<θ<90°$) with the first axis.

2. The magnetic field measurement device according to claim 1, further comprising
a plurality of sensor groups, each sensor group having the first magneto-optical sensor and the second magneto-optical sensor, wherein
the plurality of sensor groups is arranged so that the first axis of one of the plurality of sensor groups is parallel to the first axis of the other sensor groups.

3. The magnetic field measurement device according to claim 2, wherein
the plurality of sensor groups is arranged on a flat surface.

4. The magnetic field measurement device according to claim 3, wherein
the plurality of sensor groups is arranged evenly in the direction of a third axis and in the direction of a fourth axis on the flat surface, the fourth axis being perpendicular to the third axis.

5. The magnetic field measurement device according to claim 1, further comprising
rotating means for rotating the second magneto-optical sensor so that the second magneto-optical sensor measures a fifth axial component in the direction of a fifth axis that is different from the first axis and the second axis.

6. A magnetic field measurement device comprising:
a first magneto-optical sensor that is rotatable around a rotational axis and measures a first axial component of a magnetic field along a first axis that is set in the magnetic field that is to be measured;
a second magneto-optical sensor that measures a second axial component of the magnetic field along a second axis that is set in the magnetic field;
rotating means for rotating the first magneto-optical sensor so that an angle formed between the first axis and the second axis satisfies the relationship of $0°<\theta<90°$; and
an acquiring section that acquires a signal that represents the magnetic field measured by the first magneto-optical sensor after the rotation performed by the rotating means.

7. The magnetic field measurement device according to claim 6, further comprising
a plurality of sensor groups, each sensor group having the first magneto-optical sensor and the second magneto-optical sensor, wherein
the rotating means rotates the first magneto-optical sensors while the first axis of one of the plurality of sensor groups is parallel to the first axis of the other sensor groups.

8. The magnetic field measurement device according to claim 1, wherein
the magnetic field is generated by at least one current source, the magnetic field measurement device further comprising:
determining means for determining whether or not the number of current sources is 2 or more on the basis of the measurement results acquired by the first magneto-optical sensor and the second magneto-optical sensor; and
output means for outputting the result of the determination made by the determining means.

9. The magnetic field measurement device according to claim 8, further comprising:
rotating means for rotating the second magneto-optical sensor so that the second magneto-optical sensor measures a fifth axial component in the direction of a fifth axis that is different from the first axis and the second axis, wherein
the determining means makes the determination on the basis of the second and fifth axial components measured by the second magneto-optical sensor.

10. The magnetic field measurement device according to claim 1, wherein
the magnetic field is generated by at least one current source, the magnetic field measurement device further comprising:
estimating means for estimating the position of the current source on the basis of the measurement results acquired by the first magneto-optical sensor and the second magneto-optical sensor; and
output means for outputting the result of the estimation made by the estimating means.

11. The magnetic field measurement device according to claim 10, further comprising
rotating means for rotating the second magneto-optical sensor so that the second magneto-sensor measures a fifth axial component in the direction of a fifth axis that is different from the first axis and the second axis, wherein
the estimating means makes the estimation on the basis of the second and fifth axial components measured by the second magneto-optical sensor.

12. A magnetic field measurement device
comprising:
a magneto-optical sensor that measures a measurement-axis component of a magnetic field along a measurement axis that is set in the magnetic field that is to be measured, the magnetic field generated by at least one current source;
rotating means for rotating the magneto-optical sensor so that after a first axis is set in the magnetic field as the measurement axis, a second axis that forms an angle $\theta$ with the first angle is set as the measurement axis, the angle $\theta$ satisfying the relationship of $0°<\theta<90°$;
an acquiring section that acquires signals that represent the magnetic field measured by the magneto-optical sensor before and after the magneto-optical sensor is rotated by the rotating means;
estimating means for estimating the position of the current source on the basis of the measurement results acquired by the first magneto-optical sensor and the second magneto-optical sensor; and
output means for outputting the result of the estimation made by the estimating means.

13. The magnetic field measurement device according to claim 12, wherein
the rotating means rotates the second magneto-optical sensor so that the second magneto-optical sensor measures a fifth axial component in the direction of a fifth axis that is different from the first axis and the second axis, and
the estimating means makes the estimation on the basis of the second and fifth axial components measured by the second magneto-optical sensor.

* * * * *